(12) United States Patent
Perisetty

(10) Patent No.: US 6,879,535 B1
(45) Date of Patent: Apr. 12, 2005

(54) APPROACH FOR ZERO DUMMY BYTE FLASH MEMORY READ OPERATION

(75) Inventor: Srinivas Perisetty, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/929,899

(22) Filed: Aug. 30, 2004

(51) Int. Cl.$^7$ ................................................. G11C 7/00
(52) U.S. Cl. ................. 365/219; 365/230.03; 365/233; 365/189.02; 365/189.12; 365/220; 365/230.06
(58) Field of Search ............................. 365/233, 230.03, 365/189.02, 189.05, 189.12, 219, 220, 221, 230.06

(56) References Cited

U.S. PATENT DOCUMENTS 4,742,474 A * 5/1988 Knierim ..................... 345/545
4,775,859 A * 10/1988 Starkey et al. .............. 345/13

* cited by examiner

*Primary Examiner*—Andrew Q. Tran
(74) *Attorney, Agent, or Firm*—Schneck & Schneck; Thomas Schneck

(57) ABSTRACT

A nonvolatile memory device, in a continuous read operation, requires no dummy bytes between receipt of a read command and commencement of a scanning out of a first target data byte. The highest order bits of a range of possible target data bytes are speculatively read while only a partial set of the highest order address bits are received. The proper set of highest order target data bits is available and scanned out at a time a complete target data address is received. During this scan out time, the remainder of the target data byte is read and prepared for scanning out starting at the next highest order bit. In this way, the data byte targeted by a read command is available immediately and continuously after receipt of the full read command and address.

15 Claims, 6 Drawing Sheets

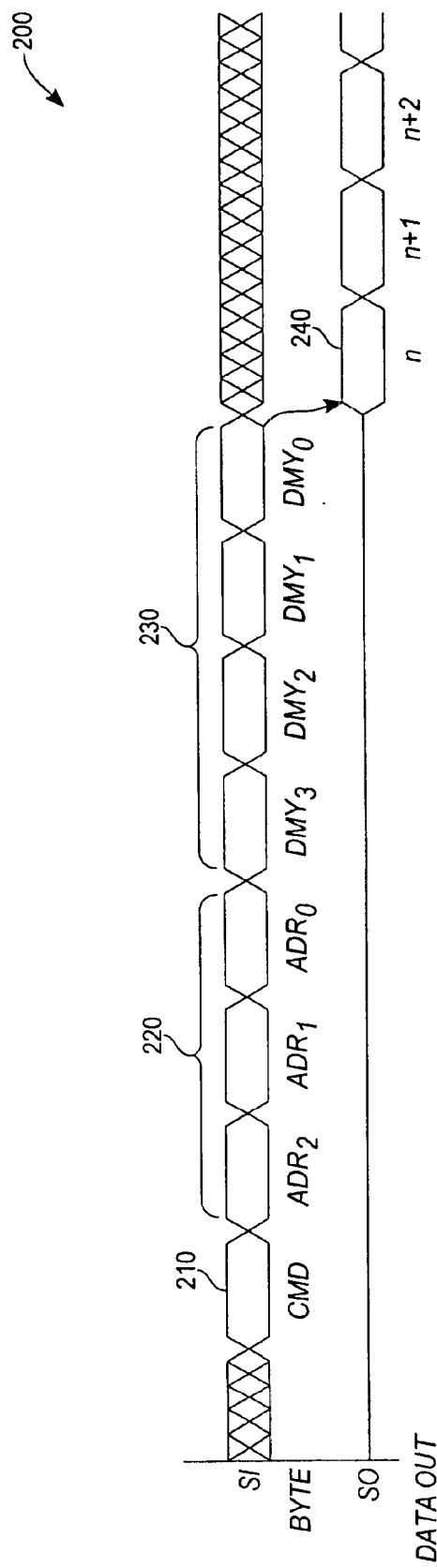

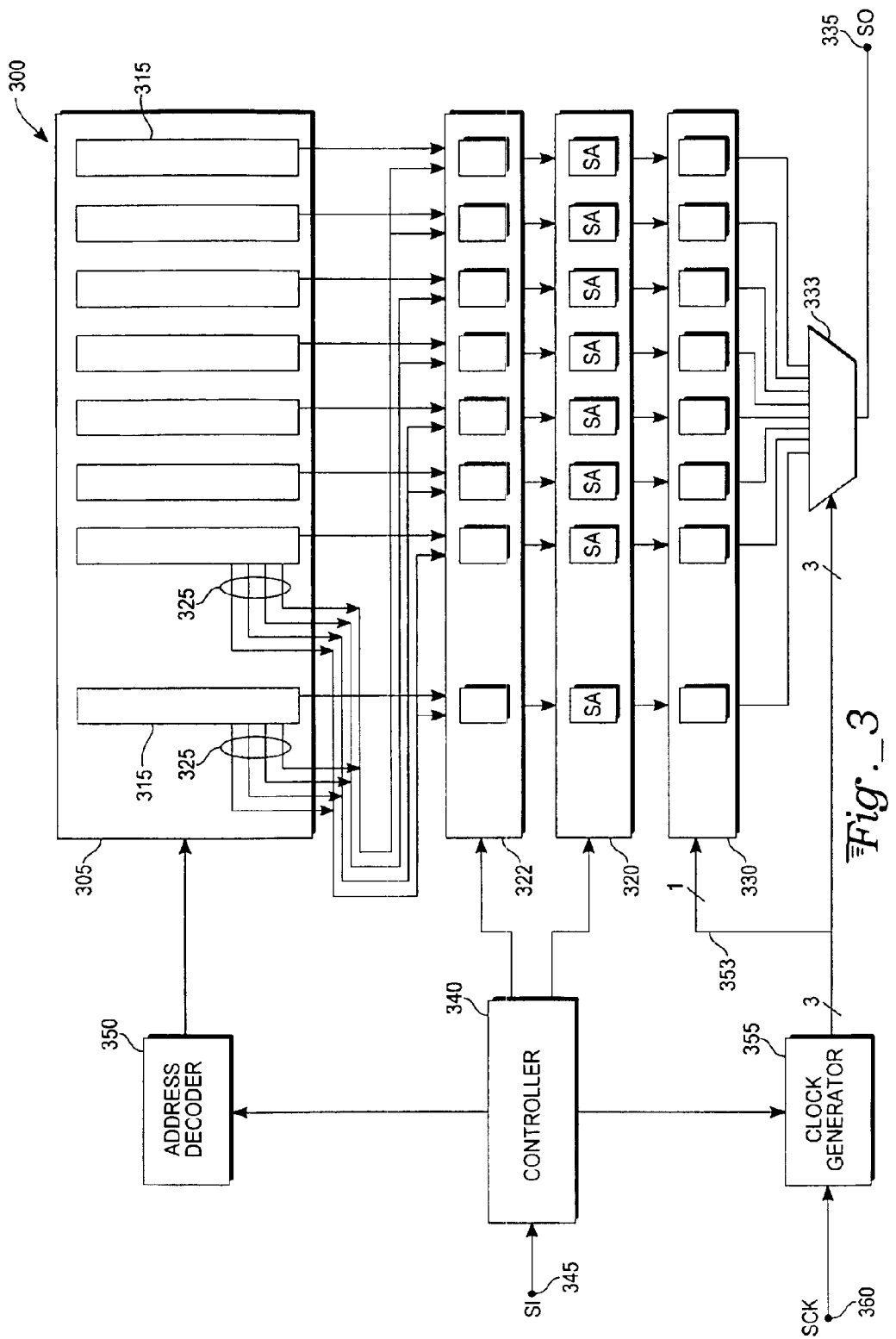
Fig._3

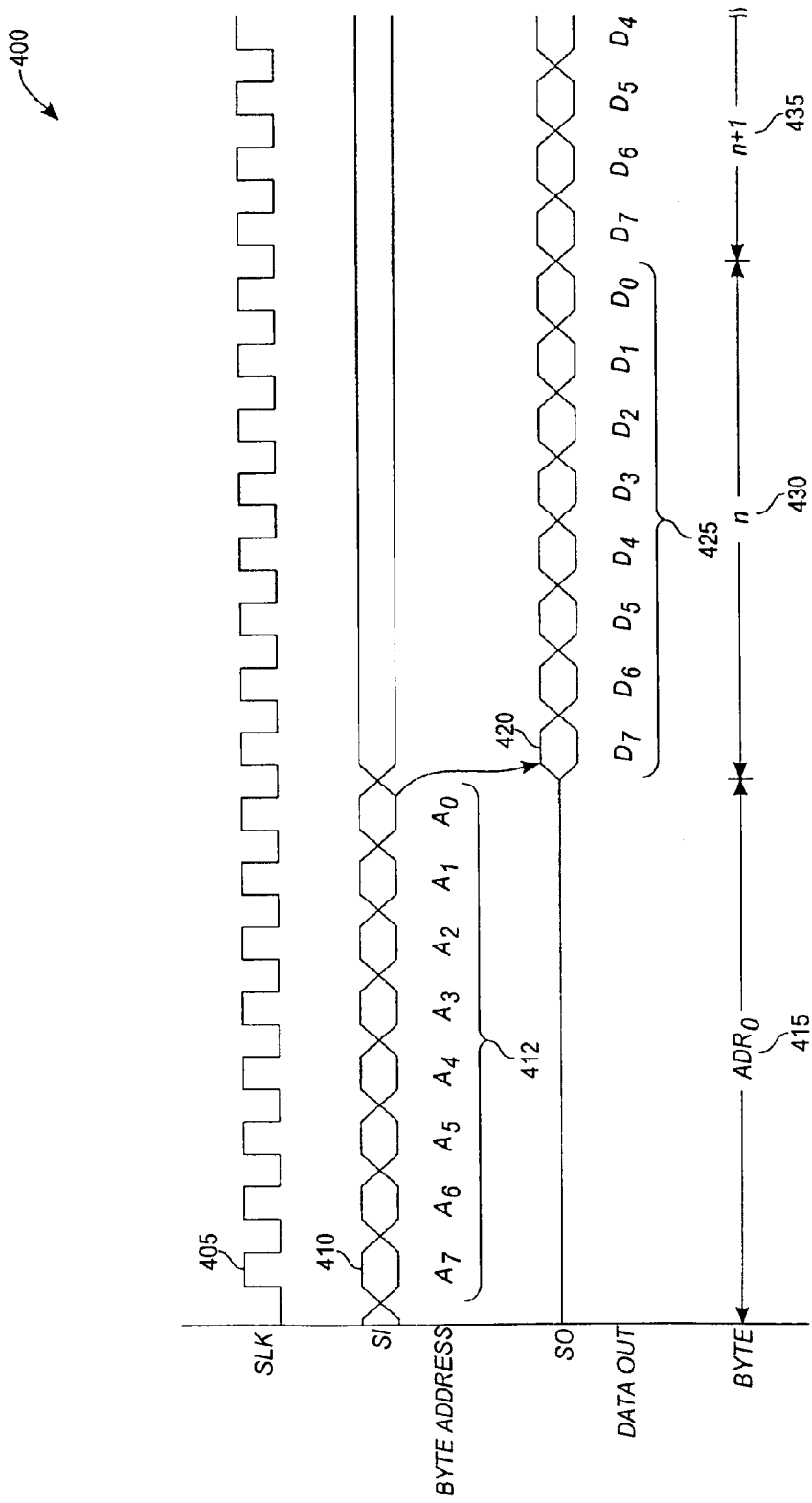
Fig._4

APPROACH FOR ZERO DUMMY BYTE FLASH MEMORY READ OPERATION

TECHNICAL FIELD

The invention relates to nonvolatile memory and sequential read operations. More specifically, the invention reduces an amount of delay to near zero between receipt of a read command and an output of data from a flash memory device.

BACKGROUND ART

Nonvolatile memories, known as flash memory devices, have become very popular in a variety of uses including mobile phones, digital answering machines, and personal digital voice recorders. Low pin count, low cost, and ease-of-use are key factors for the wide utilization of flash memory.

A flash memory may be divided into sectors at the highest level, where each sector is composed of multiple blocks, each block is composed of multiple pages, and each page is composed of hundreds of bytes. Flash memories allow for erasing, programming, and reading at the block, page, and byte level. For example, a single command may erase an entire block or page of memory.

Contents of a sequential type of flash memory may be accessed by supplying an initial address and applying a number of clock cycles equal to the number of sequential addresses desired for access in a memory operation. An internal address counter automatically increments an access address with each clock. This avoids any requirement of additional address sequencing externally. This capability allows sequential reading to cross page and sector boundaries seamlessly.

To conduct a continuous read operation, a read command is given which includes a starting memory address. After allowing a period of time for internal read operations and address decoding, a first byte of data is available commencing from the initial address given. Data from sequential addresses are available with each successive clock cycle. A drawback of reading continuously from prior sequential memories has been the amount of latency after a read command is entered until data are output. The delay from read command input and data output degrades an efficiency of continuous read operations.

With reference to FIG. 1A, a prior art nonvolatile memory 100 contains a memory array 105 including bit memory blocks 115 organized in parallel to form data words. There is a bit memory block 115 per output of the memory array 105. An output of each bit memory block 115 connects to an element of a sense amp register 120. An output of the sense amp register 120 connects to a serial data register 130. An output of the serial data register 130 connects to a serial output 135 of the nonvolatile memory 100.

A clock generator 155 receives a clock signal from a serial clock input 160. A serial data input 145 of the nonvolatile memory 100 connects to a controller 140. Commands, addresses, and data are received through the serial data input 145. The controller 140 provides control input to the clock generator 155, the sense amp register 120, and an address decoder 150.

The controller 140 receives a continuous read command followed by three bytes of address information. After decoding the continuous read command, the controller 140 and address decoder 150 determine a target data byte and connect the appropriate bits of the memory array 105 to the sense amp register 120. The first two address bytes received determine a target data byte location to the sector, block, and page level.

The byte address, the third byte, is used to to completely address the target data byte. Complete address decoding and establishment of read voltages occurs during a period of four dummy bytes occurring between the time the byte address is completely received and the first byte of data is output. Three clock lines from the clock generator 155 connect to the serial data register 130 to control which bit positions are shifted out of the serial output 135.

With reference to FIG. 1B, a prior art nonvolatile memory 110 contains a memory array 105, clock generator 155, address decoder 150, sense amp register 120, serial data register 130, and controller 140 connected as discussed supra (FIG. 1A). The inputs of a multiplexer 133 connect to a set of respective outputs of the serial data register 130. Three output lines of the clock generator 155 are encoded to select one of eight possible values. A selection of the inputs to the multiplexer is sequenced through under control of the signal values on the three clock lines from the clock generator 155. A high order clock line 153 connects to the serial data register 130 to control latching of data every eight clock cycles. An output of a multiplexer 133 connects to the serial output 135.

With reference to FIG. 2, in a continuous read operation waveform diagram 200 of the prior art, a bit stream at serial data input 145 (FIG. 1) contains a command byte 210, followed by three address bytes 220, followed by four dummy bytes 230. After receipt of the fourth dummy byte, the serial output produces the first data byte 240 available at the serial output 135. Successive target data bytes are clocked out in a similar fashion until the continuous read operation concludes.

For a system utilizing flash memories with multiple continuous read operations, the amount of latency between the read command and data output is a significant impact to overall system efficiency. A desirable operation of flash memory would be to submit a continuous read operation command and have the data available immediately after the command is entered.

DISCLOSURE OF INVENTION

A nonvolatile memory device, in a continuous read operation, requires no dummy bytes between receipt of a read command and commencement of a scanning out of a first target data byte. As byte address bits of the continuous read command are received, a range of four byte addresses is determined when all but the last two address bits are received. The two highest order bits for each of the four possible target data bytes are multiplexed to a sense amp register for reading. All four pairs of highest order bits are completely read and loaded to a serial data register by the time the last two bits of the byte address are received. Upon receiving a complete byte address, the target data byte is known and the two highest order bits of that byte are selected from the four groups and shifted out of a data register. During the time that the two highest order bits are shifted out, the target data byte address is completely determined and the target data byte is read by the sense amp register. Starting from the third highest order bit, the remainder of the target data byte is shifted out of the data register. In this way, all bits of the target data byte are read out in a continuous sequence.

A critical use of the time between receiving all but two of the target data byte address bits allows for a speculative reading of the highest order data bits for a range of possible target data bytes. This speculative read operation allows a relative slow read operation to commence on all possible combinations of target data during the time that the final address bits are received. At the conclusion of receiving all the address bits, a relatively fast multiplex operation commences, making possible the continuous scanning out of the correct set of highest order target data bits immediately after receiving the read command.

BRIEF DESCRIPTION OF DRAWINGS

FIG. 2 is a waveform diagram of a continuous read operation of the prior art nonvolatile memory of FIGS. 1A and 1B.

FIG. 3 is a block diagram of a nonvolatile memory of the present invention.

FIG. 4 is a waveform diagram of a continuous read operation in the nonvolatile memory of FIG. 3.

MODES FOR CARRYING OUT THE INVENTION

Figure 1A:
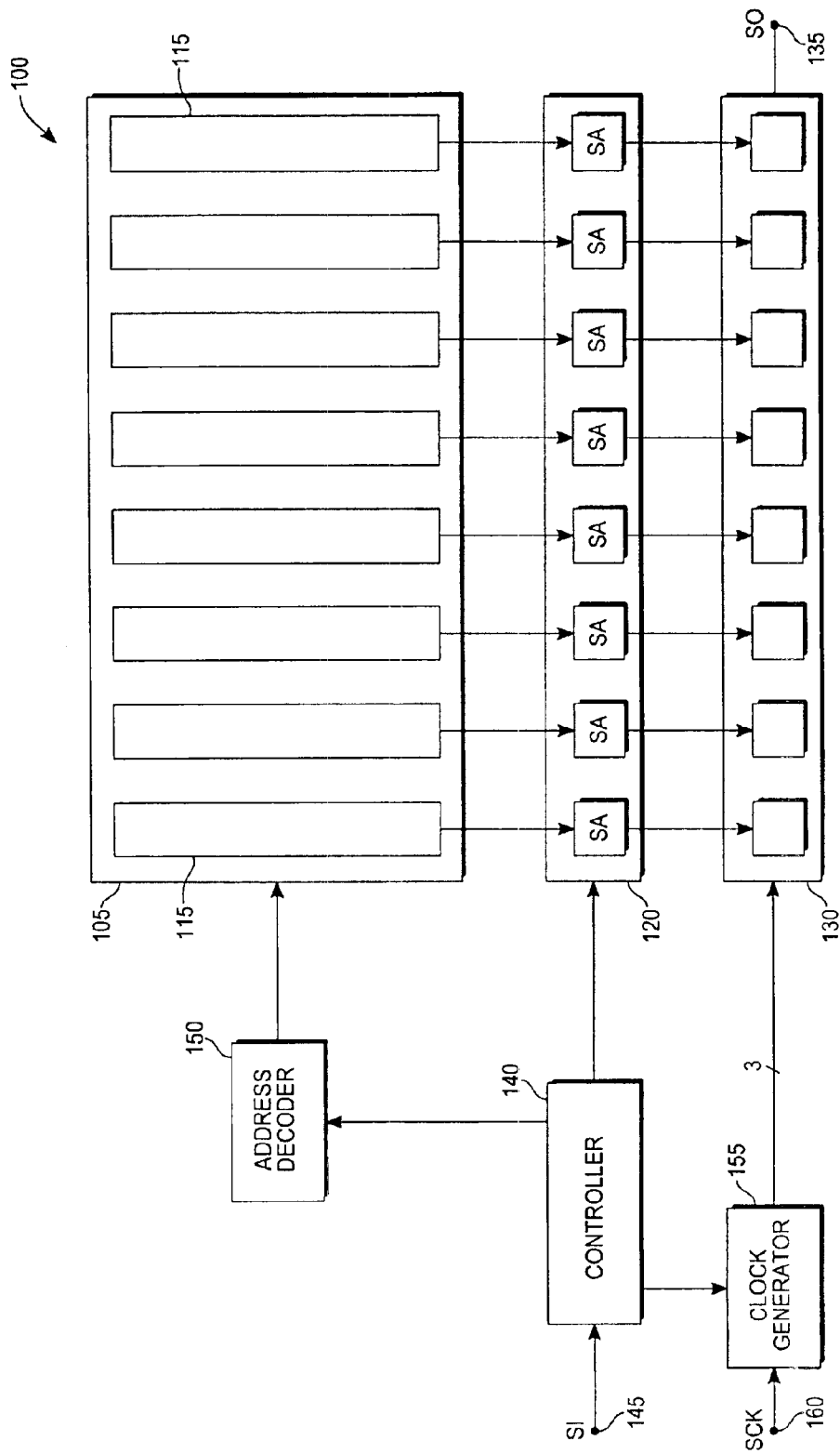
FIG. 1A is a block diagram of a prior art nonvolatile memory.
Figure 1B:
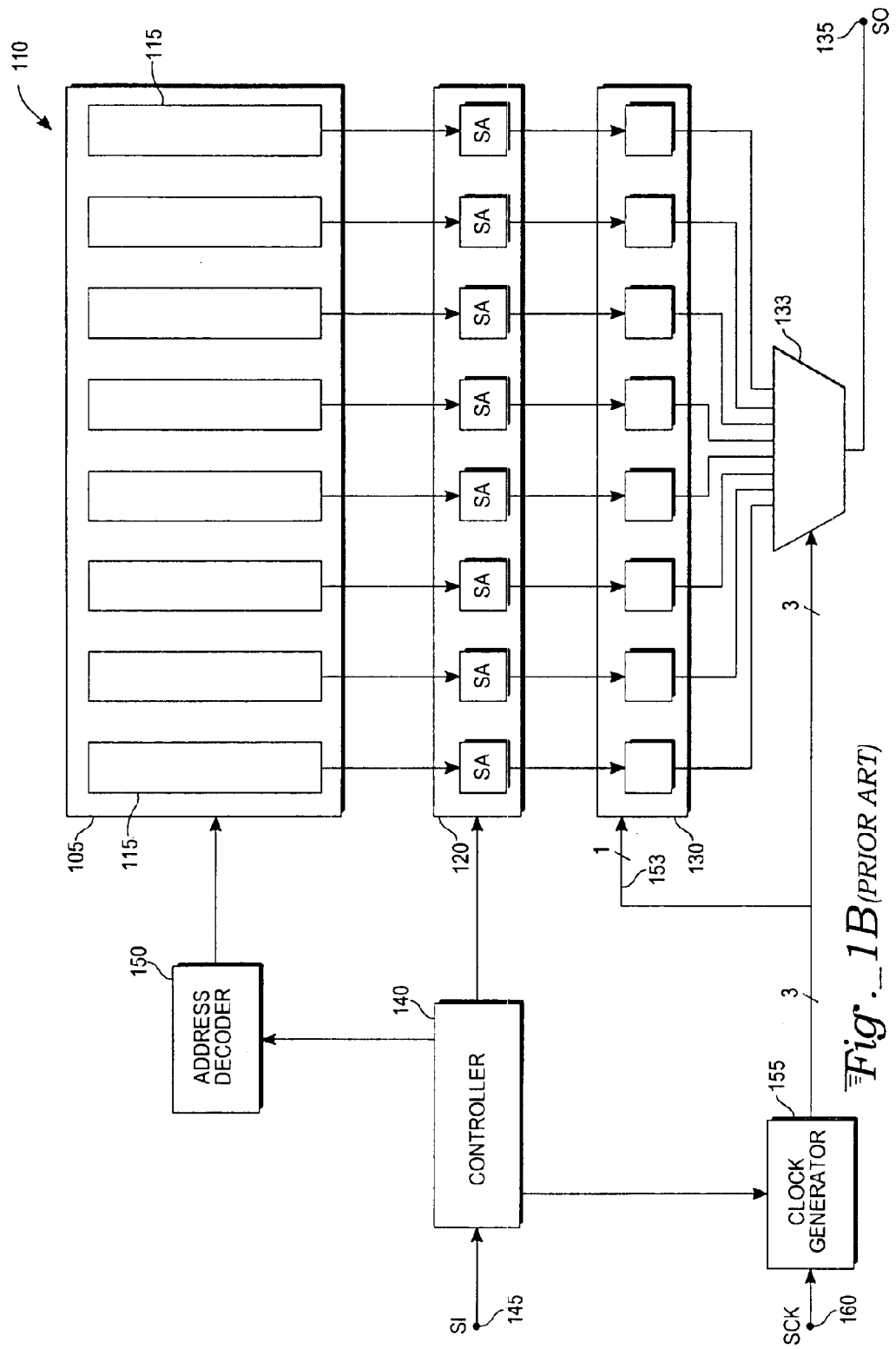
FIG. 1B is a block diagram of a prior art nonvolatile memory with a multiplexed output.

With reference to FIG. 3, an exemplary nonvolatile memory 300 contains a memory array 305 including bit memory blocks 315. The memory array 305 is organized by data bytes taken from parallel bit positions across the bit memory blocks 315. Each output of the memory array 305 has an associated bit memory block 315. An output of each bit memory block 315 is connected to a set of first input bit positions of a multiplexer register 322. Four selectable adjacent high order bit lines 325, from the two high order bit memory blocks, connect in a pair-wise fashion to a set of second input bit positions of the multiplexer register 322. An output of the multiplexer register 322 connects to a sense amp register 320. An output of the sense amp register 320 connects to a serial data register 330.

Three clock lines from a clock generator 355 connect to a multiplexer 333 to control which bit positions are shifted out of the serial data register 330 to a serial output 335. Selection of the inputs to the multiplexer is under control of the signal values on the three clock lines from the clock generator 355. The three output lines of the clock generator 355 are encoded to select one of eight possible values at a time. The inputs of the multiplexer 333 connect to a respective set of outputs of the serial data register 330. A high order clock line 353 connects to the serial data register 330 to control latching of data every eight clock cycles. An output of the multiplexer 333 connects to the serial output 335.

The clock generator 355 receives a clock signal from a serial clock input 360. A serial data input 345 of the nonvolatile memory 300 connects to a controller 340. Commands, addresses, and data are received through the serial data input 345. The controller 340 provides control input to the clock generator 355, the sense amp register 320, and an address decoder 350.

The controller 340 receives a continuous read command followed by three bytes of address information. At the time a continuous read command is decoded the controller 340 uses high order bits of the third address byte to determine a range of target data bytes for early reading. The first two address bytes received determine a first target data byte location to the sector, block, and page level.

The byte address, the third byte, is used to completely locate the target data byte. During receipt of the byte address, the first six address bits of the byte address determine four potential contiguous target data bytes. For these four potential target data bytes, the two high order bit lines 325 are routed to the multiplexer register 322. For example, two high order bit lines of a first potential target data byte location are each routed to a second position within an adjacent pair of multiplexer register 322 elements. The two high order bit lines of the remaining potential target data bytes are routed in a similar pair-wise fashion to successive sets of adjacent elements of the multiplexer register 322. A signal from the controller 340 selects the set of second input positions to the multiplexer register 322 so that all four sets of high order bit lines are connected for reading by the sense amp register 320.

The seventh and eighth bits of the byte address sequence are received and the target data byte is completely determined. During the time the last two byte address bits are received, the high order bits of the four target data bytes are read and loaded to the serial data register 330. With a complete byte address, the target data byte is read by the sense amp register 320 and concurrently the two high order bits of the target data byte are multiplexed out from the serial data register 330 through the multiplexer 333 and through the serial output 335. During the time of shifting-out the first two bits of the target data byte, the controller 340 selects the full target data byte by sending a signal to the multiplexer register 322 to activate the first set of input positions. The full target byte is transferred from the multiplexer register 322 to the respective inputs of the sense amp register 320. The full target byte is read by the sense amp register 320 and is loaded into the serial data register 330. After the second high order bit of the target data byte is shifted out, the target data byte is shifted out of the serial data register 330 starting from the third highest order bit. By this process the target data byte is read out of the serial output 335 continuously and follows directly after receipt of the third address byte of the continuous read command.

Being a sequential type of memory, the second data byte address follows the first. Read operations commence in a regular sequential and continuous manner after the speculative read operations for the first byte. During the time the first byte is read, the target byte address is incremented and reading operations begin in parallel on the second target data byte. The second data byte is completely read and ready for transferring out by the time the last bit of the first byte is transferred. All remaining data locations targeted by the continuous read operation are read in the same sequential manner as the second byte.

With reference to FIG. 4, a continuous read operation waveform diagram 400 of the exemplary nonvolatile memory 300 (FIG. 3) includes a serial clock signal 405. The serial clock signal 405 meters receipt of a target byte address stream 410. A target byte address 412 ($A_7$–$A_0$) is received with eight serial clock cycles during the time of address byte zero 415 ($ADR_0$). After receipt of the final bit of the target byte address 410, the first bit of the target data byte stream 420 is transferred out. During a first set of eight data output cycles 425 ($D_7$–$D_0$) a first target data byte 430 (n) is transferred out. The first byte is read based on the speculative read operation described supra. During the time the first byte is read, the target byte address is incremented and a full byte reading operation begins on a second target data byte 435 (n+1). A second set of eight serial clock cycles shifts out the second target data byte 435. Successive target data bytes are clocked out after being read in the same fashion as the second byte. The process proceeds until the continuous read operation concludes.

Figure 5:
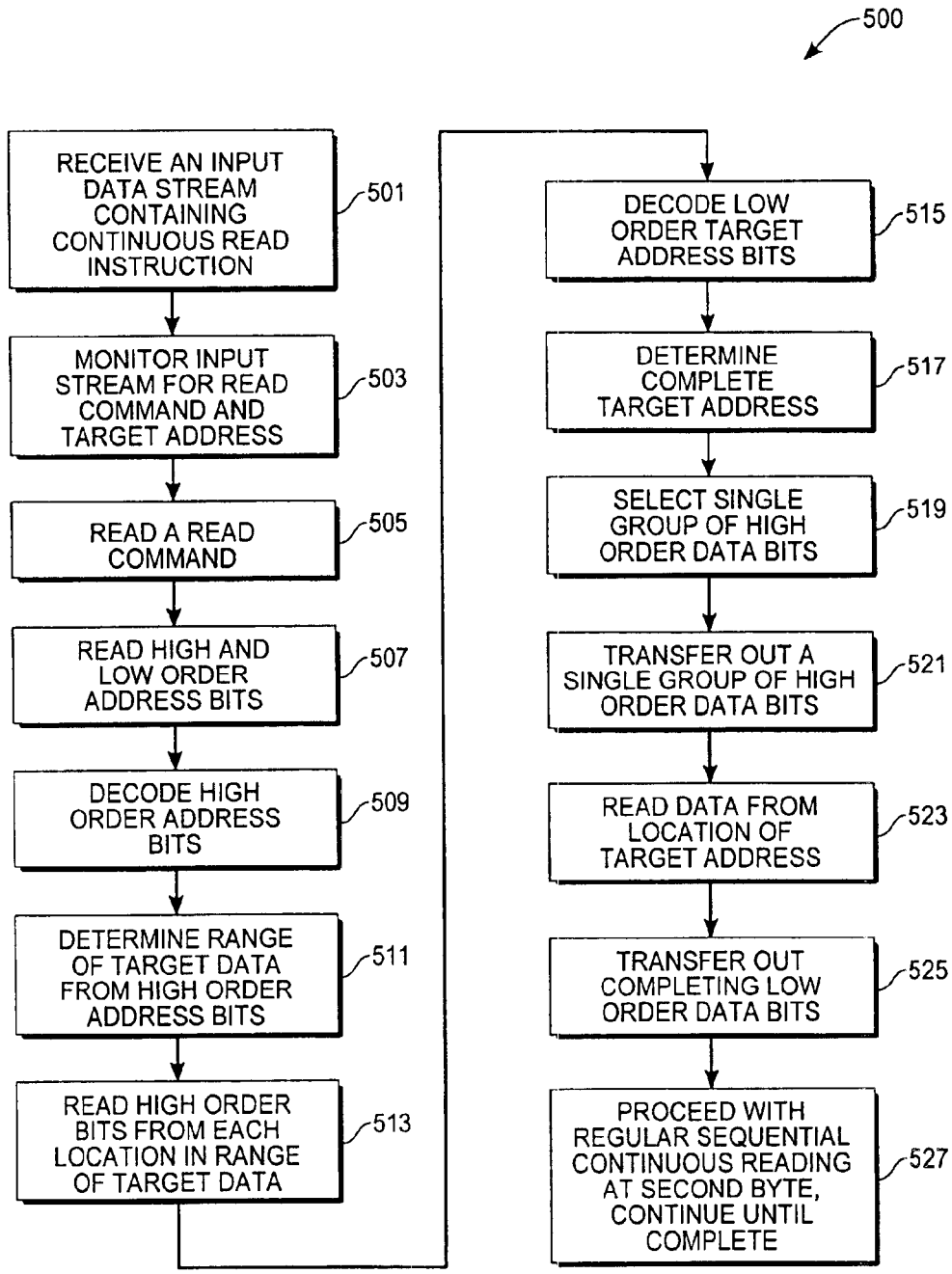
FIG. 5 is a process flow diagram of a continuous read operation of the nonvolatile memory of FIG. 3.

With reference to FIG. 5, a process flow diagram 500 of an exemplary continuous read operation includes a step 501 of receiving an input data stream containing a continuous read instruction. The process includes a step 503 of monitoring the input stream for a read command and associated target address of the read instruction. After the monitoring step, a step 505 of reading a read command and a step 507 of reading high and low order address bits follow. The stream of address bits is decoded 509 by sector, page, and byte ranges. From the address decoding step, a range of possible target data locations is determined 511 from a range of high order address bits. High order bits from each location in the range of possible target data locations are read 513. In a next step 515, decoding of low order target address bits occurs followed by determining 517 a complete target address. In a next step 519, selecting a single group of high order dated bits is based on the complete target address. The single group of high order data bits is shifting 521 out while target data from the target address location is read 523. From the complete target data the remaining low order data bits are shifted out 525.

The continuous read operation proceeds 527 with the second byte of data being read in a conventional manner. During the time the first byte is transferred out, the target address is incremented and conventional sequential read operations commence with the second full byte being read in parallel. The continuous read operation goes on in this sequential fashion until all target addresses are handled.

Although the present invention has been disclosed in terms of a particular target data byte width, as being practiced in terms of a particular sequence and range of target data byte addresses, and as commencing on a particular byte address bit, a skilled artisan will recognize that the present invention is applicable across a range of target data word or byte widths, over a range of target data address bytes, and starting on a different bit of an address byte. Within these alternatives, a different range of target data bytes may be implicated, a different sense amp read time required, or a different number of initial bits of a target data byte multiplexed out; but the essential characteristics of the present invention would be valid and understood by a skilled artisan.

Further, within the scope of the present invention a bit memory means may be implemented as a latch, a configuration of cross-coupled inverters, or a single transistor retention device, for example. A data sensing means may be crafted from sense amplifiers, latches, or a register of storage elements to illustrate a few alternatives. An addressing means may be realized from combinatorial circuitry, a compound logic gate, or a controller specialized for address selection processes. A controller means may be implemented by a finite state machine, an embedded controller, or a special-purpose processor for administering a sequence of internal operations, for example. Any memory device, which may otherwise suffer a delay between decoding a target data byte address and producing the target data at that address is appropriate for application of the present invention.

What is claimed is:

1. A memory device comprising:
    an array of bit memory elements organized by data locations;
    a bit reading register;
    a controller being configured to selectively couple said bit reading register to portions of said array of bit memory elements, said bit reading register being configured to receive either one bit from each bit memory element or a plurality of high order bits from a range of said data locations in said bit memory elements, said controller coupled to said array of bit memory elements and said bit reading register;
    a clock input coupled to said controller;
    a data register coupled to said bit reading register and said controller;
    a data input coupled to said controller; and
    an output coupled to said data register.

2. The memory device of claim 1, wherein said controller is configured to: receive a stream of address bits from said data input, monitor a sequence of bits within said stream of address bits, select said range of data locations, select a single data location from said array of bit memory elements, selectively couple said plurality of high order bits at receipt of a first range of said stream of address bits, and transfer said plurality of high order bits read to said data register.

3. The memory device of claim 2, wherein said controller is configured to: determine a single portion of said plurality of high order bits, transfer said single portion of high order bits from said data register through said output, transfer an entirety of data from said single data location determined by said stream of address bits, transfer said entirety of data to said data register, and transfer a completing portion of low order bits of said entirety of data through said output, said single portion of high order bits and said completing portion of low order bits thereby forming said entirety of data.

4. A nonvolatile memory device comprising:
    an array of bit memory blocks organized by data locations;
    an address decoder coupled to said array of bit memory blocks;
    a sense amp register;
    a controller having means for selectively coupling said sense amp register to portions of said array of bit memory blocks, said sense amp register being coupled to receive either one bit from each bit memory block or a plurality of high order bits from a range of said data locations, said controller coupled to said address decoder and said sense amp register;
    a clock generator coupled to said controller;
    a clock input coupled to said clock generator;
    a data register coupled to said sense amp register and said controller;
    a data input coupled to said controller; and
    an output coupled to said data register.

5. The memory device of claim 4, wherein said controller is configured to: receive a stream of address bits from said data input, monitor a sequence of bits within said stream of address bits, select said range of data locations, select a single data location from said array of bit memory blocks, selectively couple said plurality of high order bits at receipt of a first range of said stream of address bits, and transfer said plurality of high order bits read to said data register.

6. The memory device of claim 5, wherein said controller is configured to: determine a single portion of said plurality of high order bits, shift out said single portion of high order bits from said data register through said output, transfer an entirety of data from said single data location determined by said stream of address bits, transfer said entirety of data to said data register, and shift out a completing portion of low order bits of said entirety of data through said output, said single portion of high order bits and said completing portion of low order bits thereby forming said entirety of data.

7. A nonvolatile memory device comprising:
an array of bit memory blocks organized by data locations;
an address decoder coupled to said array of bit memory blocks;
a sense amp register;
a controller having means for selectively coupling said sense amp register to portions of said array of bit memory blocks, said sense amp register being coupled to receive either one bit from each bit memory block or a plurality of high order bits from a range of said data locations, said controller coupled to said address decoder and said sense amp register;
a clock generator coupled to said controller;
a clock input coupled to said clock generator;
a data register coupled to said sense amp register and said clock generator;
a data input coupled to said controller;
a selection means coupled to said data register and said clock generator; and
an output coupled to said selection means.

8. The memory device of claim 7, wherein said controller has means for: receiving a stream of address bits from said data input, monitoring a sequence of bits within said stream of address bits, selecting said range of data locations, selecting a single data location from said array of bit memory blocks, selectively coupling said plurality of high order bits at receipt of a first range of said stream of address bits, and transferring said plurality of high order bits read to said data register.

9. The memory device of claim 8, wherein said controller has means for: determining a single portion of said plurality of high order bits, transferring said single portion of high order bits from said data register through said input, transferring an entirety of data from said single data location determined by said stream of address bits, transferring said entirety of data to said data register, and transferring a completing portion of low order bits of said entirety of data through said output, said single portion of high order bits and said completing portion of low order bits thereby forming said entirety of data.

10. A nonvolatile memory device comprising:
an array of bit memory means for storing bits in data locations;
an addressing means for selecting a plurality of said data locations within said array of bit memory means, said addressing means coupled to said array of bit memory means;
a data sensing means for reading said data locations, said data sensing means coupled to said array of bit memory means;
a controller means for managing operations of said memory device, said controller means determining a selective coupling of said data sensing means to portions of said array of bit memory means, said data sensing means receiving either one bit for each of said bit memory means or a plurality of high order bits from a range of said data locations, said controller means coupled to said addressing means and said data sensing means;
a data register coupled to said data sensing means;
a clock generator coupled to said controller means and said data register;
a clock input coupled to said clock generator;
a data input coupled to said controller means;
a selection means coupled to said data register and said clock generator; and
an output coupled to said selection means.

11. The memory device of claim 10, wherein said controller has means for; receiving a stream of address bits from said data input, monitoring a sequence of bits within said stream of address bits, selecting said range of data locations, selecting a single data location from said array of bit memory means, selectively coupling said plurality of high order bits at receipt of a first range of said stream of address bits, and transferring said plurality of high order bits read to said data register.

12. The memory device of claim 11, wherein said controller has means for: determining a single portion of said plurality of high order bits, transferring said single portion of high order bits from said data register through said output, transferring an entirety of data from said single data location determined by said stream of address bits, transferring said entirety of data to said data register, and transferring a completing portion of low order bits of said entirety of data through said output, said single portion of high order bits and said completing portion of low order bits thereby forming said entirety of data.

13. A method of reading a flash memory comprising:
receiving a stream of input data bits containing a read instruction;
monitoring said stream of input data bits for a read command and a target address for said read instruction, said target address including high order bits and low order bits;
reading said high and low order bits of said target address;
decoding said high order target address bits;
determining a range of target data locations with said high order target address bits;
reading a set of high order data bits from each location within said range of target data;
decoding said low order target address bits;
determining a complete target address;
selecting a single group of said high order data bits corresponding to said complete target address; and
transferring said single group of high order data bits in a next clock cycle after reading said low order bits of said target address.

14. The method of reading a flash memory of claim 13, wherein said monitoring said stream of input data bits is followed by reading a read command.

15. The method of reading a flash memory of claim 13, wherein said transferring of said single group of high order data bits is followed by reading data bits from a target data location of said complete target address and transferring a completing set of low order data bits of said target data location in a next clock cycle after said transferring said single group of high order data bits.

* * * * *